US011367564B2

United States Patent
Wang (10) Patent No.: US 11,367,564 B2
(45) Date of Patent: Jun. 21, 2022

(54) MANUFACTURING METHOD OF TRANSFORMER CIRCUIT BOARD AND TRANSFORMER THEREOF

(71) Applicant: Wen-Chin Wang, Taoyuan (TW)

(72) Inventor: Eric Wang, Taoyuan (TW)

(73) Assignee: Wen-Chin Wang, Taoyuan (TW)

( * ) Notice: Subject to any disclaimer, the term of this patent is extended or adjusted under 35 U.S.C. 154(b) by 854 days.

(21) Appl. No.: 16/224,847

(22) Filed: Dec. 19, 2018

(65) Prior Publication Data

US 2020/0203065 A1   Jun. 25, 2020

(51) Int. Cl.
| | |
|---|---|
| *H01F 27/40* | (2006.01) |
| *H05K 3/34* | (2006.01) |
| *H01F 27/26* | (2006.01) |
| *H01F 41/04* | (2006.01) |

(52) U.S. Cl.
CPC .......... *H01F 27/40* (2013.01); *H01F 27/263* (2013.01); *H01F 41/04* (2013.01); *H05K 3/3473* (2013.01)

(58) Field of Classification Search
CPC ........ H01F 27/40; H01F 27/263; H01F 41/04; H05K 3/3473; Y10T 29/4902; Y10T 29/49002
USPC .............................................. 29/602.1, 592.1
See application file for complete search history.

(56) References Cited

U.S. PATENT DOCUMENTS

| | | | | |
|---|---|---|---|---|
| 6,237,218 B1 * | 5/2001 | Ogawa | ................. | H05K 3/4638 |
| | | | | 428/209 |
| 2010/0026443 A1 * | 2/2010 | Yan | ......................... | H01F 27/29 |
| | | | | 336/234 |
| 2017/0027061 A1 * | 1/2017 | Lin | ..................... | H01F 27/2804 |

* cited by examiner

*Primary Examiner* — Livius R. Cazan
*Assistant Examiner* — Azm A Parvez
(74) *Attorney, Agent, or Firm* — WPAT, PC (57) ABSTRACT

A manufacturing method of transformer circuit board includes following steps: plate stamping, forming a plurality of metal plates with a stamping mold; primary layering, layering the metal plates that are in alignment with each other between two outer insulation layers, with an inner insulation layer disposed between the two metal plates; primary pressing, hot pressing the metal plates to fix the metal plates between the two outer insulation layers; secondary layering, layering another metal plate on the outer side of the two outer insulation layers, respectively, corresponding to the positions of the previously layered metal plates; secondary pressing, hot pressing the metal plates on the outer side of the outer insulation layers, and printing to form a solder mask layer on the outer insulation layers. Finally, cutting to form a transformer circuit board with low leakage inductance and high EMI shield.

8 Claims, 7 Drawing Sheets

MANUFACTURING METHOD OF TRANSFORMER CIRCUIT BOARD AND TRANSFORMER THEREOF

BACKGROUND OF THE INVENTION

1. Field of the Invention

The present invention relates to transformers, and more particularly, to a manufacturing method of transformer circuit board and transformer thereof.

2. Description of the Related Art

Generally, the manufacturing process of a transformer will set up the copper wire diameter, the amount of wire rounds, and a plurality of windings according to the demands upon performance, voltage, current, inductance, leakage inductance, magnetic saturation efficiency, and layout.

A conventional manufacturing method of a transformer circuit board applies a photographing technique for manufacturing the layout. During the manufacturing process, exposing, developing, etching, boring, and electroplating operations are carried out on a copper foil, so as to manufacture the needed layout of each layer structure. Then, the layout of each layer structures are pressed to be combined into a complete printed circuit board, which is then combined with magnetic core. During the layout manufacturing process, a chemical agent is applied for etching the surface of the copper foil. However, a lateral etching might be caused during the etching process. In other words, the upper layer of the layout is etched for a duration longer than the bottom portion of the layout. As a result, the upper layer of the layout becomes narrower than the bottom portion of the layout. Therein, the diameter of the copper foil layout varies due to lateral etching effect, thus affecting the property of the transformer.

Specifically, the lateral etching of the copper foil surface easily causes an uneven flow of glue during the combination process. As a result, recess is easily produced on the copper foil of different layer structures. More seriously, bubbles or incomplete adherence might be caused between layer structures, which might even cause the separation of layer structures, leading to the discard of products and failing to achieve a stabilized manufacturing process.

Also, the manufacturing of the copper foil layout is complicated with the use of various chemical agents, which might cause danger upon the manufacturing environment. Further, the application of chemical agents is unable to effectively control the manufacturing quality of the layout, and might also cause the lateral etching effect of the copper foil. As a result, the manufacturing efficiency and yield rate of the transformer circuit board is affected.

SUMMARY OF THE INVENTION

For improving the manufacturing issues of the transformer circuit board, a manufacturing method of transformer circuit board is disclosed. With the layout on the copper foil being stamping molded without the operations of exposing, developing, and etching, the lateral etching issues is resolved, and the yield rate of the transformer circuit board is improved.

For achieving the aforementioned objectives, the manufacturing method of transformer circuit board is provided, comprising steps of:

plate stamping, forming a plurality of metal plates with a stamping mold, the metal plates having an alignment hole, respectively, the alignment holes being arranged in an axial alignment;

primary layering, layering the metal plates between two outer insulation layers and placing the metal plates in axial alignment with each other by use of the alignment holes, with an inner insulation layer disposed between two neighboring metal plates, so as to form a multi-layer structure having a plurality of metal plates and inner insulation layer;

primary pressing, hot pressing to combine the outer insulation layers and the inner insulation layer in a thermal melting manner to fix the metal plates between the two outer insulation layers;

secondary layering, layering another metal plate on an outer side of the two outer insulation layers, respectively, at a position corresponding to positions of the alignment holes of the previously layered metal plates; and secondary pressing, hot pressing the metal plates on the outer side of the outer insulation layers to achieve a tight combination thereof, and printing to form a solder mask layer on each of the outer insulation layers, and cutting to form a transformer circuit board.

A transformer in accordance with an embodiment of the present invention is provided, comprising the transformer circuit board formed by the manufacturing method aforementioned.

Therefore, the metal plates of the present invention are stamped to be formed with corresponding mold, so as to replace the conventional operations of exposing, developing, and etching by use of chemical agents, thus preventing lateral etching upon copper foil from occurring and improving the yield rate of the manufacturing process of transformer circuit board. Also, consistency of the layouts on each metal plate is enhanced, thus improving the production quality and efficiency.

DETAILED DESCRIPTION OF THE INVENTION

The aforementioned and further advantages and features of the present invention will be understood by reference to the description of the preferred embodiment in conjunction with the accompanying drawings.

Referring to FIG. 1 to FIG. 10, a manufacturing method of transformer circuit board 100 and transformer thereof are provided, the method comprising following steps: plate stamping S1, primary layering S2, primary pressing S3, secondary layering S4, secondary pressing S5, and boring S6.

Figure 1:
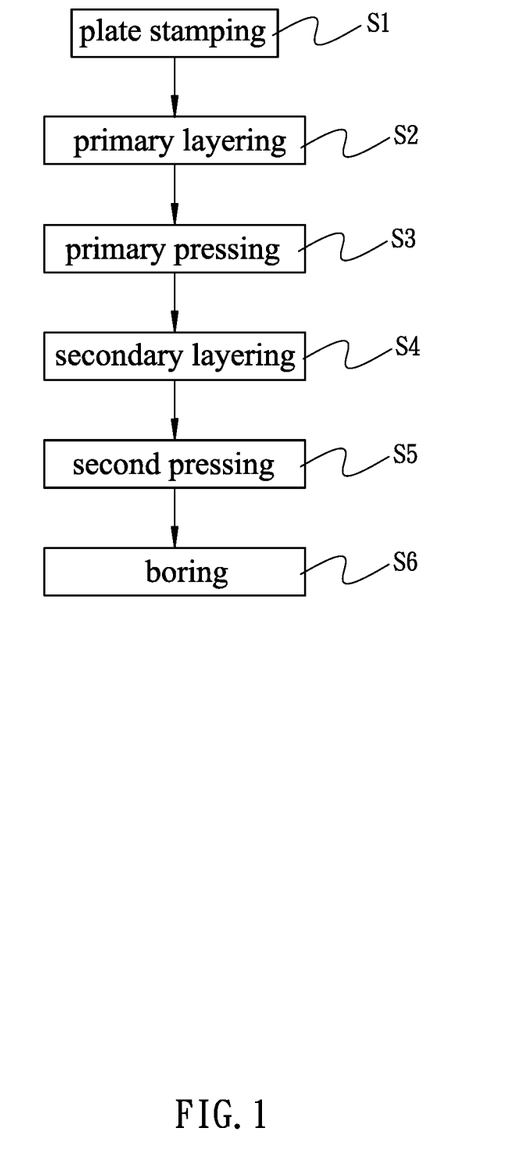
FIG. 1 is a flow chart of operation steps in accordance with an embodiment of the present invention.
Figure 2:
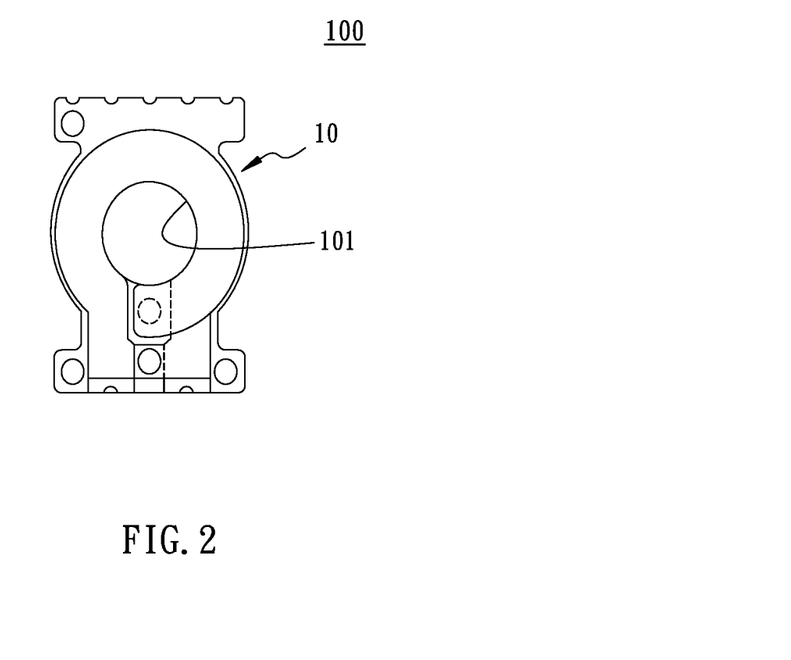
FIG. 2 is a schematic view illustrating the structure of a singular transformer circuit board.
Figure 3:
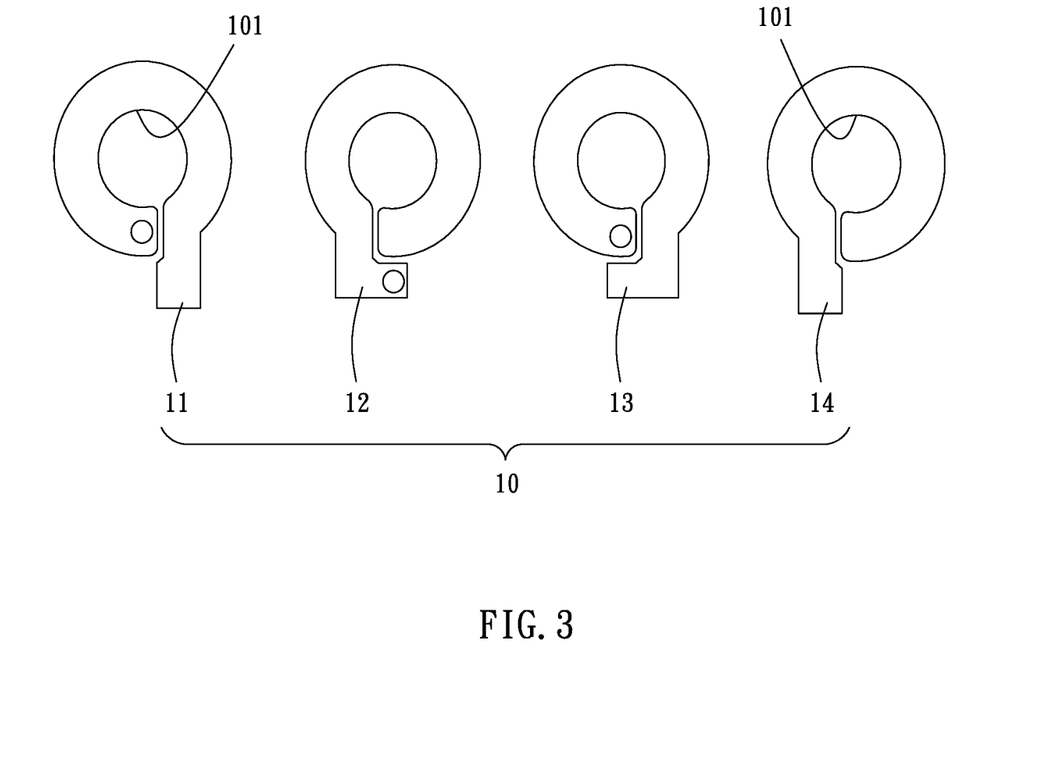
FIG. 3 is a schematic view illustrating the structure of each layer of metal plate.

In plate stamping S1 step, as shown by FIG. 1 to FIG. 3, a plurality of metal plates 10 are formed by use of a stamping mold, wherein each metal plate 10 is allowed to be formed in a different shape. In an embodiment of the present invention, each metal plate 10 is a self-adhesive copper foil, and the stamping mold for stamping each metal plate 10 is manufactured by CNC lathe or laser engraving. Therein, each metal plate 10 has an alignment hole 101 disposed at the center of the metal plate 10, respectively, and the alignment holes 101 are arranged in an axial alignment. As for different metal plates 10, the inner layout of each metal plate 10 will differ according to different layering orders.

In primary layering S2 step, as shown by FIG. 1 to FIG. 5, a plurality of metal plates 10 of each layer are equidistantly placed in a horizontal alignment, and the metal plate 10 of two neighboring layers are placed in a vertical alignment, so as to manufacture a plurality of transformer circuit boards 100 in a single time. Therefore, the manufacturing efficiency is significantly improved. However, the embodiment of the present invention is illustrated with a singular transformer circuit board 100. Therein, the primary layering S2 step of the transformer circuit board 100 is illustrated below. First, a plurality of metal plates 10 are vertically layered between two outer insulation layers 20, and the metal plates 10 are arranged in alignment by the alignment holes 101, with an inner insulation layer 21 disposed between each two neighboring metal plate 10, so as to form a plurality of metal plates 10 and inner insulation layer 21 that are alternately layered. In an embodiment of the present invention, two layers of metal plates 10 are layered between two outer insulation layers 20, with a singular inner insulation layer 21 disposed between the two metal plates 10. However, the present invention is not limited to such disclosure. The metal plates 10 between the two outer insulation layers 20 are allowed to be layered to more than two layers. Also, the outer insulation layer 20 and the inner insulation layer 21 are glass fiber resin sheets having consistent area and thickness.

Figure 4:
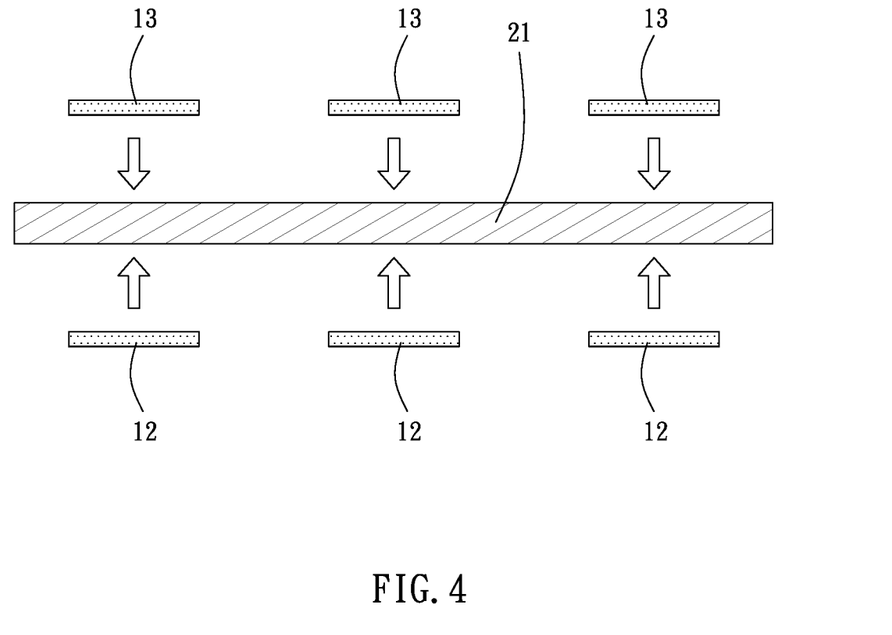
FIG. 4 is a schematic view of the operation of primary layering Step in accordance with the present invention, illustrating the second metal plate and the third metal plate placed on two sides of the inner insulation layer.
Figure 5:
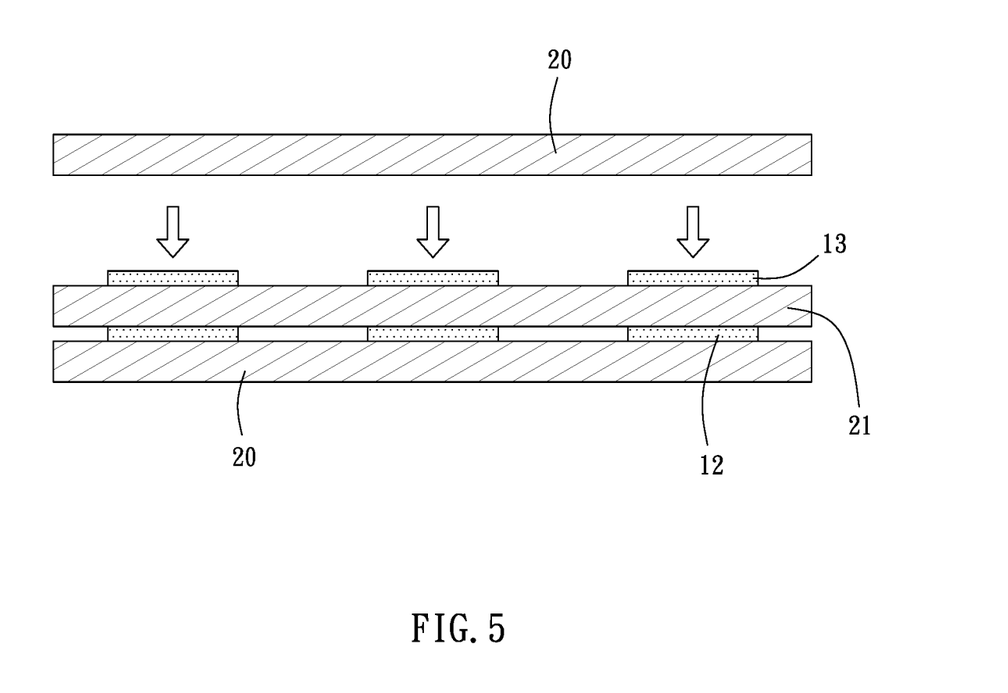
FIG. 5 is a schematic view of the operation of primary layering Step, illustrating two outer insulation layers placed on the second metal plate and the third metal plate, respectively.

Notably, the corresponding vertical positions of the metal plates 10 on each layer are important, such that any deviation will invalidate the conduction between the layouts. Therefore, the self-adhesive metal plates 10 of each layer are allowed to be manually layered or layered by use of automatic equipment. Therein, regarding to the manually layering manner, the relative positions are projected on two sides of the corresponding inner insulations through infrared rays with a layout patterns in a 1:1 scale. Next, each self-adhesive metal plate 10 is adhered on the target position on each inner insulation layer 21. Finally, the outer insulation layers 20 are placed on each corresponding metal plate 10, such that the metal plate 10 are layered between two outer insulation layers 20. Regarding the automatically layering manner, each metal plate 10 is grabbed by mechanical arm of the automatic equipment, so as to be placed on the relative position corresponding to each inner insulation layer 21. Therefore, two metal plate 10 are accurately layered, and the outer insulation layers 20 are then placed on each metal plate 10 by the mechanical arm.

Figure 6:
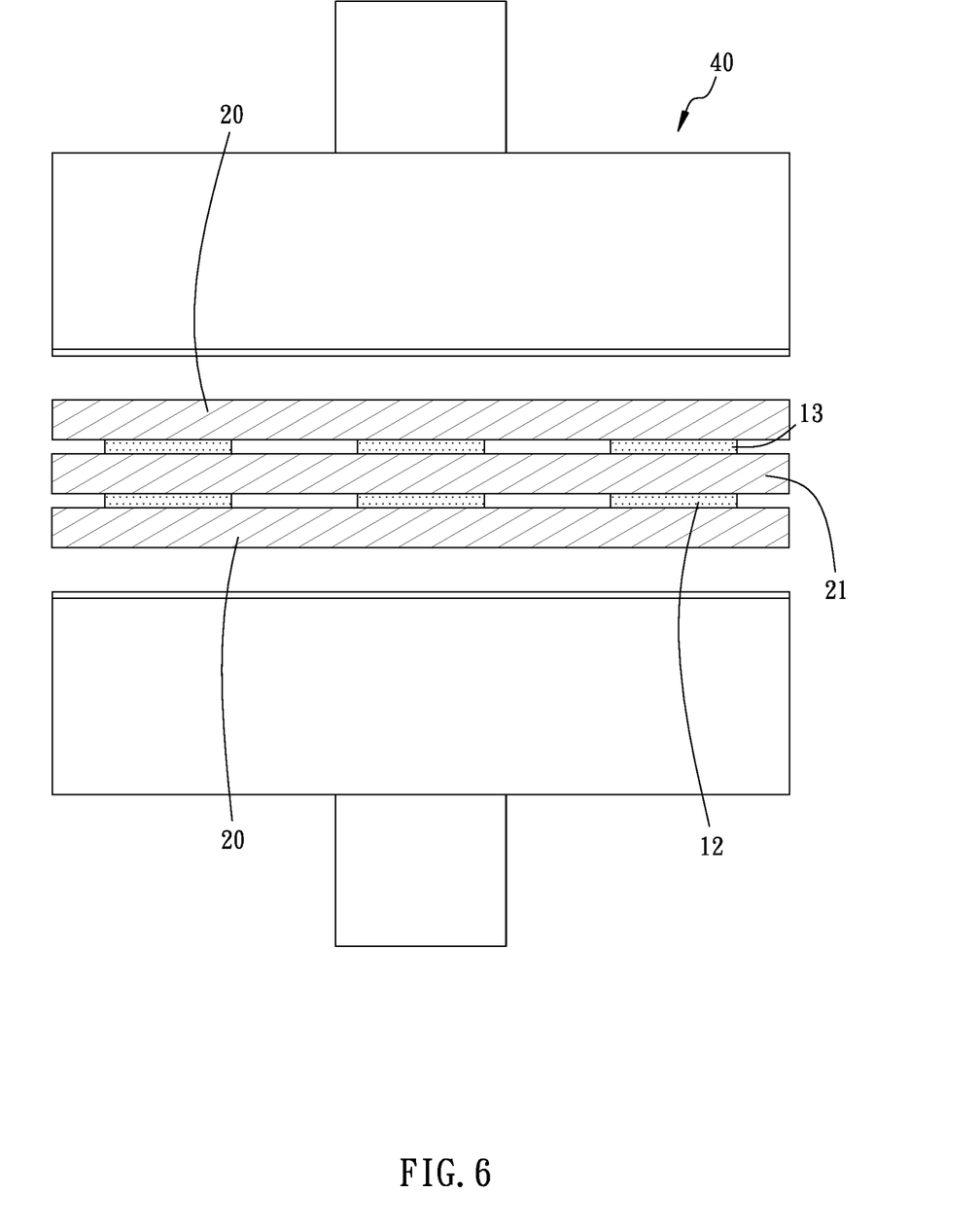
FIG. 6 is a schematic view of the operation of primary pressing Step.

In the primary pressing S3 step, as shown by FIG. 1 and FIG. 6, the neighboring outer insulation layers 20 and the inner insulation layer 21 are hot-pressed by a hot press machine 40, so as to fill the gap between the outer insulation layer 20 and the inner insulation layer 21 by thermal melting. Therefore, the metal plate 10 is fixed between the two outer insulation layers 20, and the thermally melted combination between the outer insulation layer 20 and the inner insulation layer 21 is evenly distributed.

Figure 7:
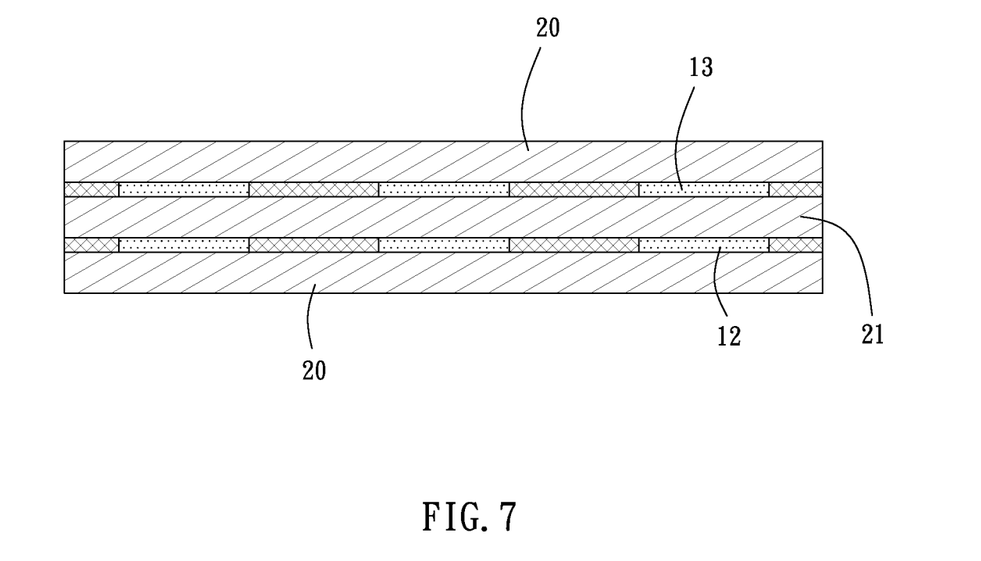
FIG. 7 is a sectional view of the present invention after the primary pressing Step.
Figure 8:
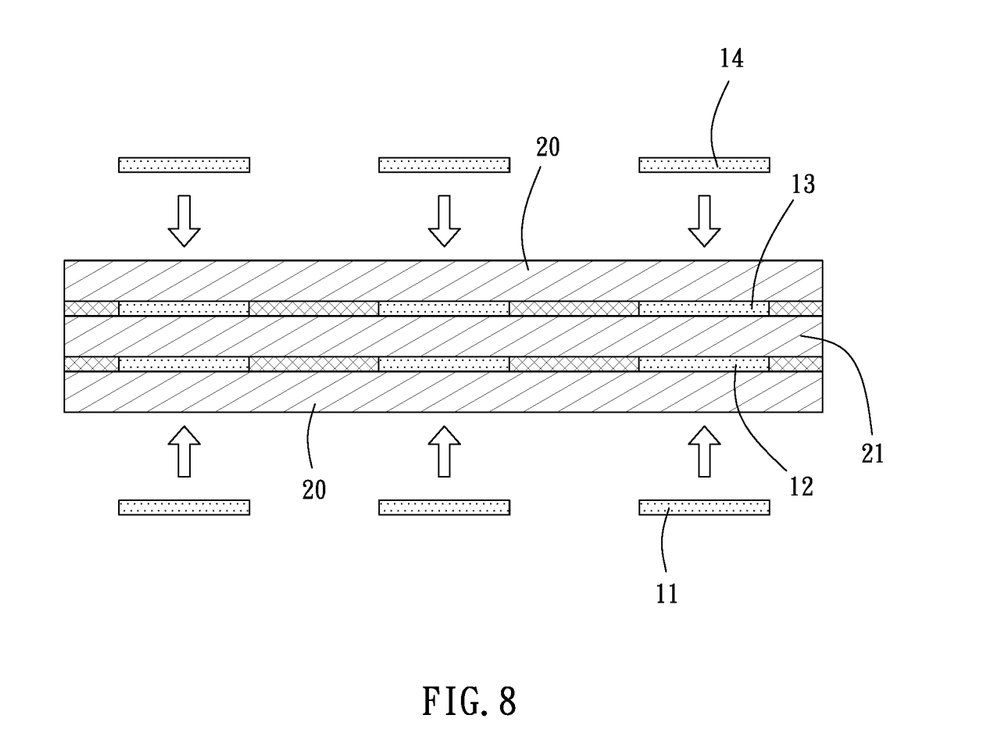
FIG. 8 is a schematic view of the operation of secondary layering step, illustrating the first metal plate and the fourth metal plated placed on the outer insulation layer, respectively.

In the secondary layering S4 step, as shown by FIG. 1, FIG. 7, and FIG. 8, after the primary pressing S3, the aforementioned manually or automatically layering process is repeated, so as to layer another metal plate 10 on the outer side of each outer insulation layer 20 with the alignment holes 101 of each metal plate 10 being arranged in alignment. No additional insulations are needed to be placed. Therefore, the metal plate 10 is formed in a four-layer structured. For further improving the accuracy of the layering position of metal plates 10 on each layer, when the layering process is complete, the layering positions and layouts of the metal plates 10 are scanned by X-ray for preventing any deviations from existing, thus precisely improving the accuracy of the layering position of the metal plates 10.

More specifically, the metal plate 10 of the present invention comprises a first metal plate 11, a second metal plate 12, a third metal plate 13, and a fourth metal plate 14, wherein the first metal plate 11 and the fourth metal plate 14 are disposed on the outer side of the two outer insulation layers 20, respectively, and the second metal plate 12 and the third metal plate 13 are disposed on the inner side of the two outer insulation layers 20 and the two sides of the inner insulation layer 21, respectively. Therefore, the inner insulation layer 21 is positioned between the second metal plate 12 and the third metal plate 13. Therein, the layout of the first metal plate 11 is identical to the layout of the fourth metal plate 14, and the layout of the second metal plate 12 is identical to the layout of the third metal plate 13, while the layout of the first metal plate 11 is different from the layout of the second metal plate 12. As shown by FIG. 2, FIG. 3, and FIG. 8, when the metal plate 10 is alternately layered with each outer insulation layer 20 and each inner insulation layer 21, the first metal plate 11 and the fourth metal plate 14 are horizontally presented in a mirror image; also, the second metal plate 12 and the third metal plate 13 are horizontally presented in a mirror image. Therefore, after the vertical layering process, the first metal plate 11 and the fourth metal plate 14 are structurally reversed; the second metal plate 12 and the third metal plate 13 are structurally reversed.

Figure 9:
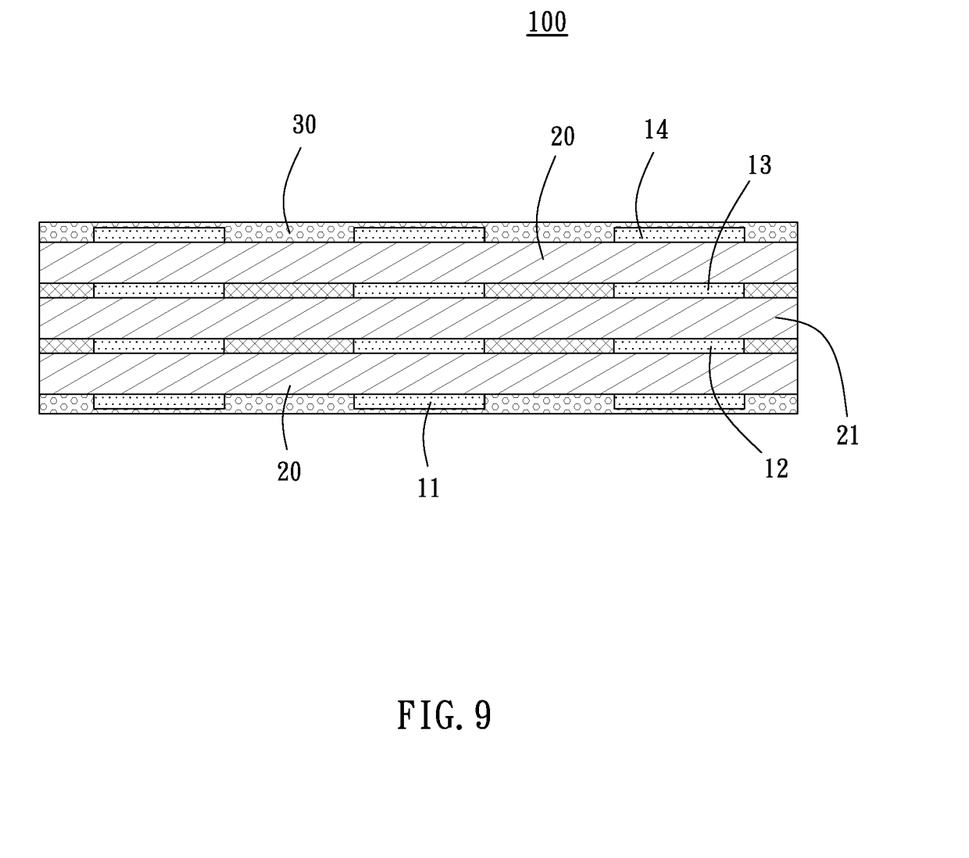
FIG. 9 is a schematic view of the operation of secondary pressing step.

In the secondary pressing S5 step, as shown by FIG. 1 and FIG. 9, the hot press machine 40 is applied again for assuring that the first metal plate 11 and the fourth metal plate 14 are stably adhered on the two outer insulation layers 20, respectively.

Figure 10:
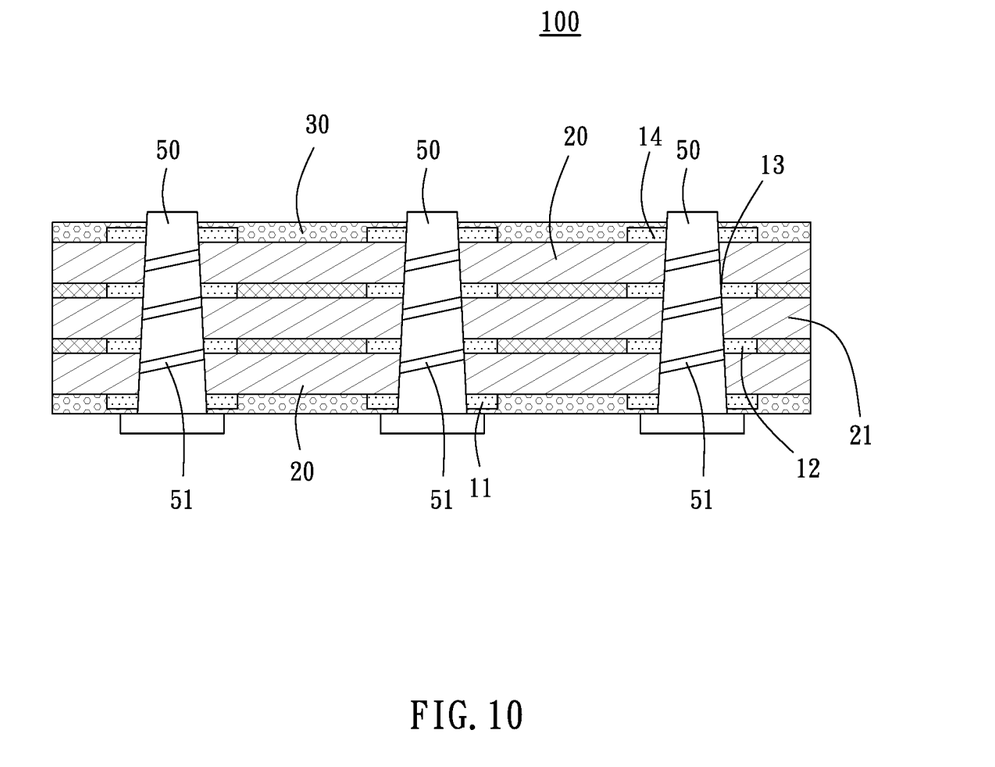
FIG. 10 is a schematic view of the operation of boring Step.

In the boring S6 step, as shown by FIG. 10, an amount of through bores for electrical conduction are formed according to different demands. An automatic boring machine is applied for boring the layout of each metal plate 10, so as to form the needed through bores, and the through bores of the metal plates 10 of each layer are then electroplated by a horizontal electroplating equipment. Then, a solder mask ink is coated on the outer side of each outer insulation layer 20 to undergo a screen printing process, so as to form a solder mask layer 30 on each outer insulation layer 20 for protecting the metal plates 10 exposed on the outer side of the outer insulation layer 20, thus preventing short cut or open cut due to scrape from occurring, and achieving a solder mask function. Subsequently, the solder mask layer 30 is plated with an anti-oxidative layer for preventing the exposed solder mask layer 30 and through bores from oxidation, facilitating further soldering operation. Then, the whole metal plate 10 is cut by a forming machine to form a transformer circuit board 100 in the target size.

Subsequently, each through bore is soldered with a connection pillar 50 for fixing the structure of the transformer circuit board 100. In an embodiment of the present invention, each connection pillar 50 is formed in a column shape tapering from the bottom to the top. Also, each connection pillar 50 has a helical surface which is favorable for the solder to flow into a guide groove 51 of each connection pillar 50.

Finally, the transformer circuit board 100 is glued with a matched magnetic core to form a transformer, which subsequently undergoes various property tests of different inspection instruments, including inductance, coils ratio, leakage inductance, voltage, and pressure resistance. Therefore, a transformer with low leakage inductance and high electro-magnetic interference shield is acquired.

To sum up, the present invention achieves several advantages.

The metal plates 10 of the present invention are stamped to be formed with corresponding mold, so as to replace the conventional operations of exposing, developing, and etching by use of chemical agents, thus preventing lateral etching upon copper foil from occurring and improving the yield rate of the manufacturing process of transformer circuit board 100. Also, consistency of the layouts on each metal plate 10 is enhanced, thus improving the production quality and efficiency.

Also, with an accurate alignment during the layering process, the metal plates 10 of each layer are arranged in a precise alignment for preventing positional deviation between the metal plates 10 from occurring. In addition, the manufacturing process of the metal plates 10 of the present invention eliminates the issues of lateral etching, so as to further increase the stability of transformer circuit board 100. Also, the transformer circuit board 100 is combined with corresponding magnetic core, thus forming a transformer having low leakage inductance and high electro-magnetic interference shield.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A manufacturing method of a transformer circuit board, comprising following steps:
    plate stamping, forming a plurality of metal plates with a stamping mold, each metal plate having an alignment hole, respectively, the alignment holes of the metal plates being arranged in an axial alignment;
    primary layering, layering the metal plates between two outer insulation layers and placing the metal plates in axial alignment with each other by aligning the alignment holes, with an inner insulation layer disposed between two neighboring metal plates, so as to form a multi-layer structure having a plurality of metal plates and inner insulation layer alternately arranged;
    primary pressing, hot pressing to combine the outer insulation layers and the inner insulation layer in a thermal melting manner to fix the metal plates between the two outer insulation layers;
    secondary layering, layering another metal plate on an outer side of the two outer insulation layers, respectively, at a position corresponding to positions of the alignment holes of the previously placed metal plates; and
    secondary pressing, hot pressing the metal plates on the outer side of the outer insulation layers to achieve a tight combination thereof, and screen printing to form a solder mask layer on each of the outer insulation layers, and cutting to form a transformer circuit board;
    wherein in the primary layering step and the secondary layering step, the metal plates of each layer are placed in a vertical alignment; also, relative positions between the metal plates and layouts on the metal plates are scanned with X-ray for calibrating any deviations thereof; and
    wherein in the primary layering step, the metal plates of each layer are self-adhesive and manually layered up; the relative positions of the metal plates are projected on corresponding target positions on the inner insulation layer through infrared rays with a layout patterns in a 1:1 scale, and each self-adhesive metal plate is manually adhered on target positions of the inner insulation layer, with each outer insulation layer being disposed afterward.

2. The method of claim 1, wherein in the secondary layering step, each self-adhesive metal plate is manually positioned and adhered to a target position on the outer insulation layer and arranged in alignment with the metal plate on an inner side of the outer insulation layer; each metal plate comprises a first metal plate, a second metal plate, a third metal plate, and a fourth metal plate, wherein the first metal plate and the fourth metal plate are disposed on the outer side of the two outer insulation layers, and the second metal plate and the third metal plate are orderly disposed on the inner side of the two outer insulation layers between the two outer insulation layers, with the inner insulation layer disposed between the second metal plate and the third metal plate; when the metal plates are alternately layered with the outer insulation layers and the inner insulation layer, the first metal plate and the fourth metal plate are structurally reversed, and the second metal plate and the third metal plate are structurally reversed.

3. The method of claim 1, wherein in the alternately layered up metal plates, outer insulation layers, and the inner insulation layer, a plurality of metal plates of each layer are equidistantly placed in a horizontal alignment, and the metal plates of two neighboring layers are placed in a vertical alignment, so as to manufacture a plurality of transformer circuit boards in a single processing time.

4. A manufacturing method of a transformer circuit board, comprising following steps:
    plate stamping, forming a plurality of metal plates with a stamping mold, each metal plate having an alignment hole, respectively, the alignment holes of the metal plates being arranged in an axial alignment;
    primary layering, layering the metal plates between two outer insulation layers and placing the metal plates in axial alignment with each other by aligning the alignment holes, with an inner insulation layer disposed between two neighboring metal plates, so as to form a multi-layer structure having a plurality of metal plates and inner insulation layer alternately arranged;

primary pressing, hot pressing to combine the outer insulation layers and the inner insulation layer in a thermal melting manner to fix the metal plates between the two outer insulation layers;

secondary layering, layering another metal plate on an outer side of the two outer insulation layers, respectively, at a position corresponding to positions of the alignment holes of the previously placed metal plates; and secondary pressing, hot pressing the metal plates on the outer side of the outer insulation layers to achieve a tight combination thereof, and screen printing to form a solder mask layer on each of the outer insulation layers, and cutting to form a transformer circuit board;

wherein in the primary layering step and the secondary layering step, the metal plates of each layer are placed in a vertical alignment; also, relative positions between the metal plates and layouts on the metal plates are scanned with X-ray for calibrating any deviations thereof; and wherein in the primary layering step, the metal plates of each layer are self-adhesive and automatically layered up, wherein each metal plate is grabbed by a mechanical arm of an automatic equipment, so as to be placed and adhered on the relative position corresponding to the position of the metal plate on the inner insulation layer, and then the outer insulation layers are placed.

5. The method of claim 4, wherein in the secondary layering step, each self-adhesive metal plate is positioned to a target position on the outer insulation layer and arranged in alignment with the metal plate on an inner side of the outer insulation layer; each metal plate comprises a first metal plate, a second metal plate, a third metal plate, and a fourth metal plate, wherein the first metal plate and the fourth metal plate are disposed on the outer side of the two outer insulation layers, and the second metal plate and the third metal plate are orderly disposed on the inner side of the two outer insulation layers between the two outer insulation layers, with the inner insulation layer disposed between the second metal plate and the third metal plate; when the metal plates are alternately layered with the outer insulation layers and the inner insulation layer, the first metal plate and the fourth metal plate are structurally reversed, and the second metal plate and the third metal plate are structurally reversed.

6. The method of claim 4, wherein in the alternately layered up metal plates, outer insulation layers, and the inner insulation layer, a plurality of metal plates of each layer are equidistantly placed in a horizontal alignment, and the metal plates of two neighboring layers are placed in a vertical alignment, so as to manufacture a plurality of transformer circuit boards in a single processing time.

7. A manufacturing method of a transformer circuit board, comprising following steps:

plate stamping, forming a plurality of metal plates with a stamping mold, each metal plate having an alignment hole, respectively, the alignment holes of the metal plates being arranged in an axial alignment;

primary layering, layering the metal plates between two outer insulation layers and placing the metal plates in axial alignment with each other by aligning the alignment holes, with an inner insulation layer disposed between two neighboring metal plates, so as to form a multi-layer structure having a plurality of metal plates and inner insulation layer alternately arranged;

primary pressing, hot pressing to combine the outer insulation layers and the inner insulation layer in a thermal melting manner to fix the metal plates between the two outer insulation layers;

secondary layering, layering another metal plate on an outer side of the two outer insulation layers, respectively, at a position corresponding to positions of the alignment holes of the previously placed metal plates; and secondary pressing, hot pressing the metal plates on the outer side of the outer insulation layers to achieve a tight combination thereof, and screen printing to form a solder mask layer on each of the outer insulation layers, and cutting to form a transformer circuit board;

wherein after the secondary pressing step, a boring step is further comprised, in which a through bore is formed on a layout of each metal plate, and a solder mask layer is printed on each outer insulation layer, with a connection pillar soldered for each through bore for fixedly connecting the metal plates; and wherein each connection pillar is formed in a column shape tapering from a bottom portion to a top portion thereof, and each connection pillar has a helical surface for solder material to flow into a guide groove of the connection pillar.

8. The method of claim 7, wherein in the alternately layered up metal plates, outer insulation layers, and the inner insulation layer, a plurality of metal plates of each layer are equidistantly placed in a horizontal alignment, and the metal plates of two neighboring layers are placed in a vertical alignment, so as to manufacture a plurality of transformer circuit boards in a single processing time.

* * * * *